United States Patent
Takahashi et al.

[11] Patent Number: 6,036,080
[45] Date of Patent: Mar. 14, 2000

[54] WIRE BONDING METHOD

[75] Inventors: Kuniyuki Takahashi; Minoru Torihata, both of Musashimurayama; Kazumasa Kimura, Nishitama-gun; Tatsunari Mii, Musashimurayama, all of Japan

[73] Assignee: Kabushiki Kaisha Shinkawa, Tokyo, Japan

[21] Appl. No.: 09/035,608

[22] Filed: Mar. 5, 1998

[30] Foreign Application Priority Data

Mar. 6, 1997 [JP] Japan .................................. 9-069288

[51] Int. Cl.[7] .......................... B23K 31/02; B23K 37/00; B23K 1/00; B23K 5/22
[52] U.S. Cl. ........................ 228/180.5; 228/4.5; 228/102; 228/213
[58] Field of Search ................................. 228/180.5, 4.5, 228/212, 213, 102

[56] References Cited

U.S. PATENT DOCUMENTS

| 4,932,584 | 6/1990 | Yamazaki et al. ........................ 228/179 |
| 5,156,323 | 10/1992 | Kumazawa et al. ..................... 228/179 |
| 5,205,463 | 4/1993 | Holdgrafer et al. ..................... 228/102 |

FOREIGN PATENT DOCUMENTS

| S63-52778 | 10/1988 | Japan . |
| H4-318943 | 11/1992 | Japan . |
| H5-60657 | 9/1993 | Japan . |

*Primary Examiner*—Patrick Ryan
*Assistant Examiner*—Zidia J. Pittman
*Attorney, Agent, or Firm*—Koda & Androlia

[57] ABSTRACT

A wire bonding method for bonding a first bonding point and then a second bonding point by bonding wire that passes through a capillary including a reverse operation that moves the capillary in a direction opposite from a second bonding point after the bonding is done to the first bonding point, a damper is closed temporarily during the reverse operation so as to apply tension to the wire, thus forming a strong kink at an uppermost point of the neck height portion of a resulting wire loop between the first and second bonding points.

4 Claims, 4 Drawing Sheets

WIRE BONDING METHOD

BACKGROUND OF THE INVENTION

1. Field of the Invention

The present invention relates to a wire bonding method for connecting a first bonding point and a second bonding point by a wire in a process of manufacturing a semiconductor device and more particularly to a method for forming a wire loop between the first and second bonding points.

2. Prior Art

As shown in FIG. 6, a typical wire bonding method includes a step in which a pad 2a (first bonding point) on a semiconductor chip 2 mounted on a lead frame 1 is connected to a lead 1a (second bonding point) on the lead frame 1 by a bonding wire (merely called "wire") 3; and loop shapes of the wire 3 that connects the first and second bonding points include a triangular loop shown in FIG. 6(a), and a trapezoidal loop shown in FIG. 6(b).

The triangular loop shown in FIG. 6(a) has kink 3a at the uppermost point of the neck height portion 31. The trapezoidal loop shown in FIG. 6(b) has, in addition to the kink 3a, another kink 3b in the area of the bend between the trapezoidal length portion 32 and the inclined portion 33.

Wire loop formation methods described above are disclosed, for instance, in Japanese Examined Patent Publication (Kokoku) No. H5-60657 and in Japanese Pre-Examined Patent Publication (Kokai) No. H4-318943.

Of the above two prior arts, Japanese Examined Patent Publication (Kokoku) No. H5-60657 discloses a wire bonding method in which the kink 3a is formed. This method for forming the kink 3a is described with reference to FIG. 7.

In step (a) of FIG. 7, a capillary 5 is lowered while a damper 4 which holds the wire 3 is maintained in an open state, and a ball which is formed on the tip end of the wire 3 is bonded to the first bonding point A. Then, the capillary 5 is raised slightly to point B, and the wire 3 is delivered. Next, in step (b), the capillary 5 is moved horizontally by a small amount to point C in the opposite direction from the second bonding point H (where the lead 1a is located) (see FIG. 6). Subsequently, in step (c), the capillary 5 is raised.

Generally, the operation described above in which the capillary 5 is moved in the opposite direction from the second bonding H (or point 1a) is referred to as a "reverse operation". As a result of this reverse operation, the wire 3 assumes an inclined shape between the points A and C (see step (b) of FIG. 7); and as a result a kink 3a is formed in the wire 3 by the lower end portion (tip end portion) of the capillary 5. The wire 3 that is delivered in this reverse operation from point A to point C makes up the neck height portion 31 of the loop shown in FIG. 6.

As disclosed in, for instance, Japanese Examined Patent Publication (Kokoku) No. S63-52778, back tension is applied to a part of the wire 3 that is located above the capillary 5 by blowing air onto the wire 3 from an air nozzle during the bonding process so that the wire 3 is pulled upward. However, since the air nozzle that blows out air is located above the capillary 5 in a position away from the capillary 5, and since the wire 3 is extremely slender, the strength of this back tension is inherently limited; and sufficient back tension cannot be applied to the portion of the wire 3 located near the capillary 5.

Consequently, as shown in FIG. 8, the portion of the wire 3 located near the lower end of the capillary 5 is not sufficiently inclined toward the first bonding point A, and a strong kink 3a is not formed by the lower end portion of the capillary 5. Furthermore, since the wire 3c is delivered by the reverse operation in which the capillary 5 is moved from point B to point C, the wire shape and position of the kink 3a formed by the lower end portion of the capillary 5 fluctuate. As a result of these problems, it is impossible to obtain a stable loop shape and a high shape retention force.

The kink 3a can be strengthened by increasing the amount of the reverse operation of the capillary 5 so as to eliminate the slack in the wire 3 which is caused by the delivering of the wire 3c from the lower end of the capillary 5. However, if the amount of the reverse operation is increased, an extra amount of wire (3c) is delivered by the reverse operation; and as a result, the height of the neck height portion 31 increases, and a low wire loop shape cannot be obtained.

SUMMARY OF THE INVENTION

Accordingly, the object of the present invention is to provide a wire bonding method which forms a strong kink at the uppermost point of the neck height or at both the uppermost point of the neck height and the bent portion in a trapezoidal loop, thus providing a stable wire loop shape that has a high shape retention force.

Another object of the present invention is to provide a wire bonding method which can form a low wire loop shape.

The objects of the present invention are accomplished by a unique process for a bonding method in which a reverse operation that moves a capillary in a direction opposite from a second bonding point is performed during the loop formation operation which connects first and second bonding points, and the unique process includes a temporary closing of a damper during the reverse operation of the capillary so that tension is applied to the wire.

DETAILED DESCRIPTION OF THE INVENTION

Figure 6A:
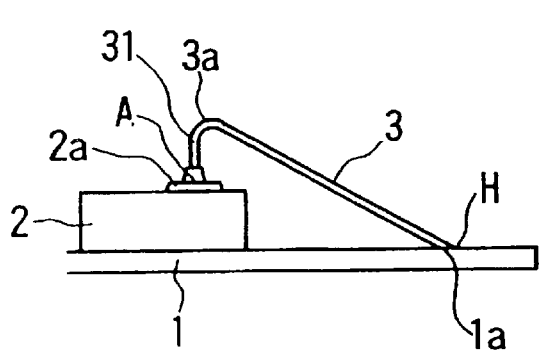
FIG. 6(a) shows a triangular wire loop.

A first embodiment of the present invention will be described with reference to FIGS. 1 through 3. This embodiment is to form a triangular loop of the type shown in FIG. 6(a).

Figure 1:
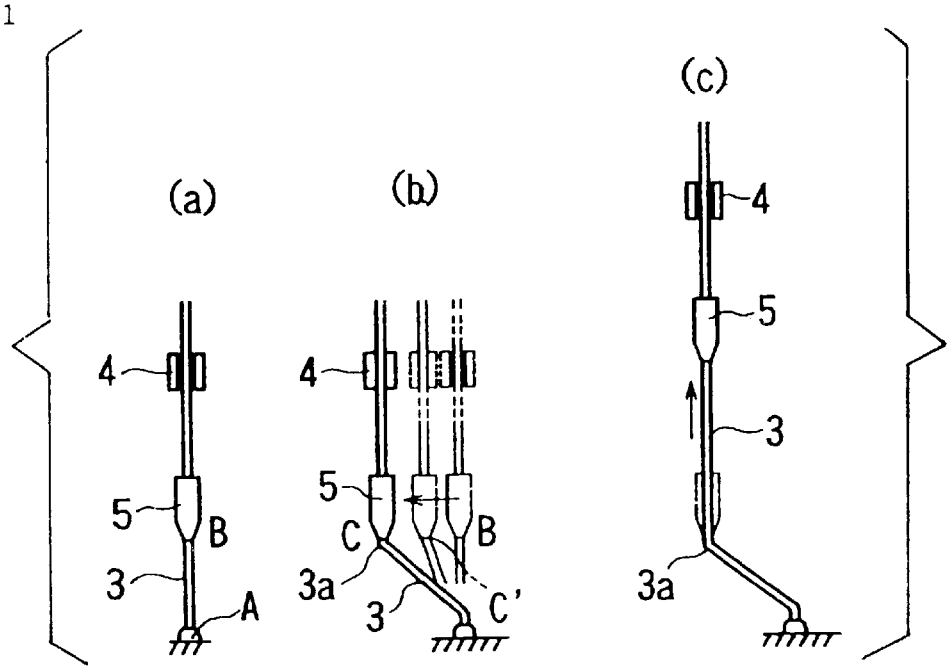
FIG. 1 illustrates various wire shapes in respective steps in which a capillary is moved according to a first embodiment of the wire bonding method of the present invention.
Figure 2:
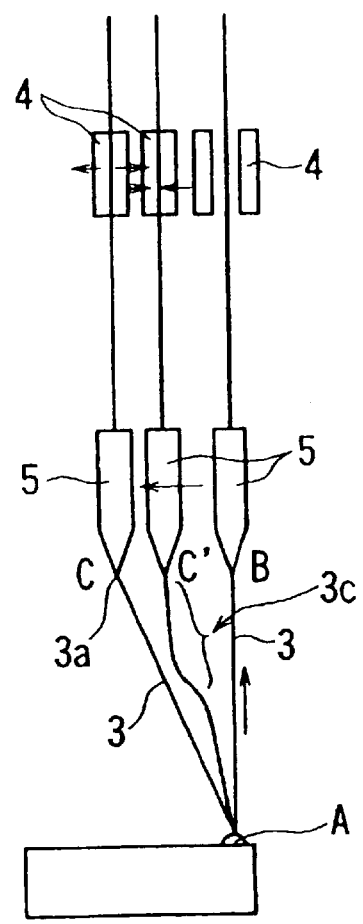
FIG. 2 is an enlarged diagram of the step (b) of FIG. 1.
Figure 3:
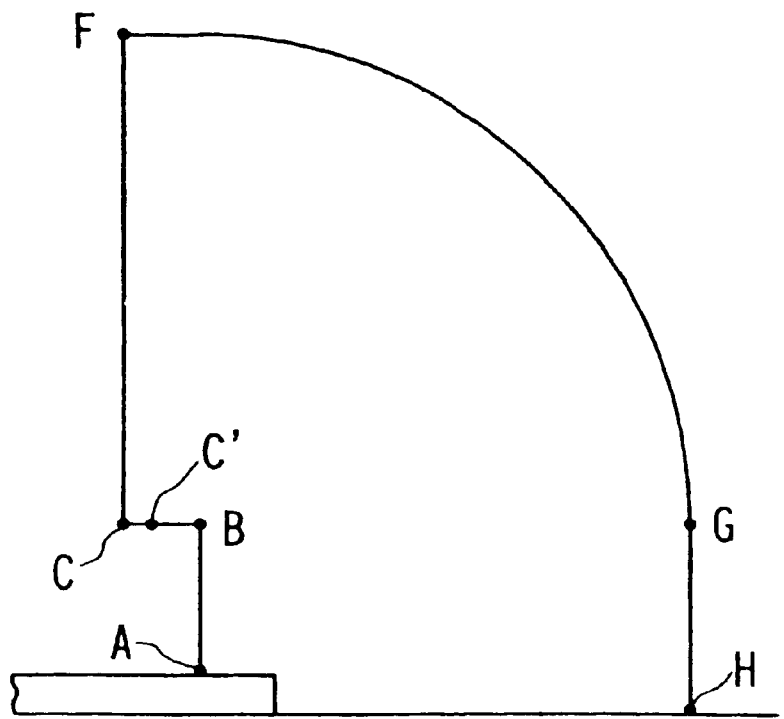
FIG. 3 illustrates the moving path of a capillary according to the first embodiment.

As shown in step (a) of FIG. 1 and in FIG. 3, the capillary 5 is lowered while the damper 4 which holds the bonding wire (called "wire") 3 is kept open, and the ball formed at the tip end of the wire 3 is bonded to the first bonding point A. Afterward, the capillary 5 is raised slightly to point B (or first raised point) while delivering the wire 3. This operation is the same as in a conventional method.

Next, as shown in step (b) of FIG. 1 and in FIG. 3, a reverse operation is performed; in other words, the capillary 5 is moved horizontally by a slight amount from point B to point C (second raised point), which is in a direction opposite from the second bonding point H (see FIG. 6), with the clamper 4 opened. In the present embodiment, as shown in FIGS. 1 and 2, the clamper 4 is closed at point C' during this reverse operation. When the damper 4 is thus closed during the reverse operation, the delivery of the wire 3 from the capillary 5 is halted; and as a result, slack appears in the wire 3 at the lower end of the capillary 5 due to the reverse operation performed up to this point (C'). However, this slack is eliminated by the tension applied to the portion of the wire 3 that lies between the first bonding point A to point C. Such a tension is applied by the lower end of the capillary 5 which is moved from point C' to point C with the clamper 4 closed.

As a result, the wire 3 assumes a shape inclining from point A to point C; and in addition, as described above, since the slack at the lower end portion of the capillary 5 is eliminated by the applied tension, a strong kink 3a is formed in the wire 3 at the lower end portion of the capillary 5. Furthermore, this kink 3a can be formed at a desired position of the neck height portion of the obtained loop (see FIG. 6).

As a result, a wire loop shape with a stable neck height portion 31 can be obtained; and a wire loop shape that has a high shape retention force can be obtained. In addition, since a strong kink 3a is formed regardless of the amount of the reverse operation, it is possible to lower the neck height portion in the resulting loop.

In the above method, from point C where the reverse operation is ended, the clamper 4 is opened; and an operation which is the same as that performed in a conventional method is performed.

For example, as shown in step (c) of FIG. 1 and in FIG. 3, the capillary 5 is raised to point F (third raised point) while delivering an amount of wire which is required for forming the wire loop. Afterward, the damper 4 is closed. When the damper 4 is thus closed, no further wire 3 is delivered even if the capillary 5 is subsequently moved. Then, the capillary 5 is moved along a circular arc path with a radius centered on the first bonding point A or a point near the first bonding point A until the capillary 5 reaches point G which is located above the second bonding point H; and the capillary 5 is lowered so that bonding of the wire 3 to the second bonding point H is performed.

The process of moving the capillary 5 from point C to the second bonding point H has no direct relationship with the feature of the present invention; accordingly, it is possible to perform an operation similar to the operation disclosed in the conventional method or to perform various other operations.

Figure 4:
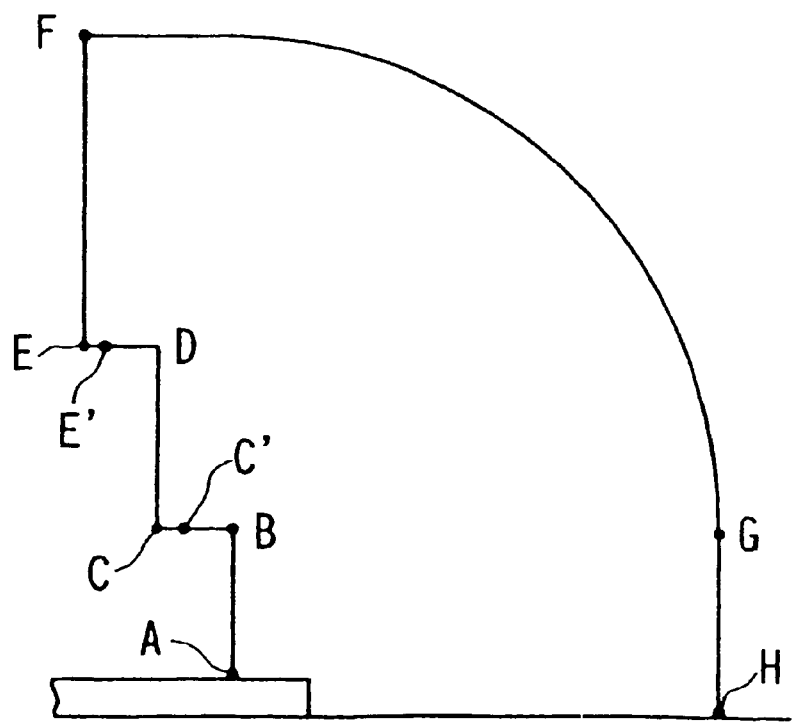
FIG. 4 illustrates the moving path of a capillary according to the second embodiment of the method of the present invention.
Figure 6B:
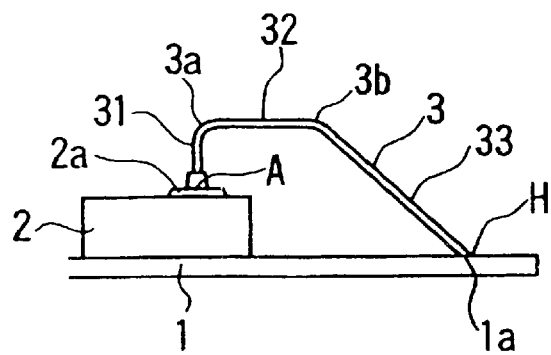
FIG. 6(b) shows a trapezoidal wire loop.
Figure 7:
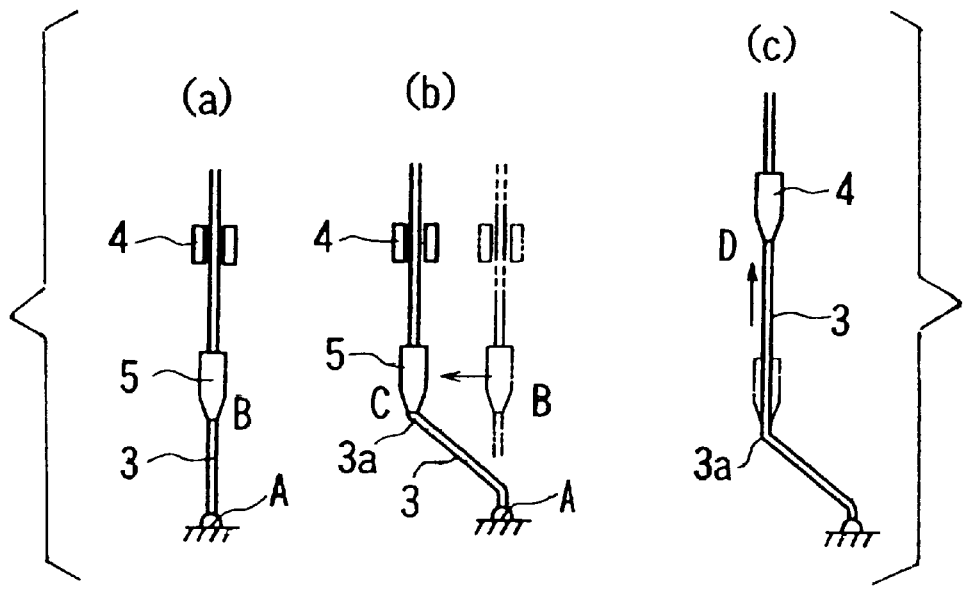
FIG. 7 shows wire shapes formed by the movement of the capillary in various steps of a conventional wire bonding method.
Figure 8:
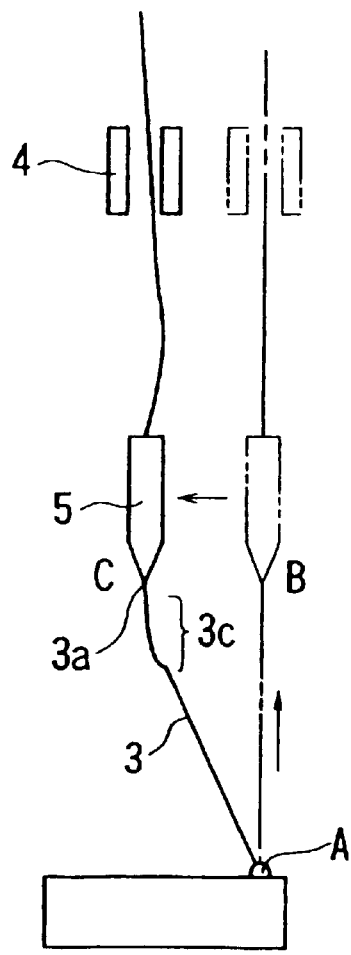
FIG. 8 is an enlarged diagram of the step (b) of FIG. 7.

FIG. 4 illustrates a moving path of the capillary 5 according to the second embodiment of the present invention which forms a trapezoidal loop of the type shown in FIG. 6(b).

Here, the process from the first bonding point A to point C is the same as in the first embodiment including the reverse operation performed with the damper being closed; as a result, a strong kink 3a is formed at the uppermost point of the neck height 31 as in the first embodiment.

At point C, the damper 4 is opened, and the capillary 5 is raised to point D, delivering the wire 3. Afterward, another reverse operation is performed to the capillary 5; in other words, the capillary 5 is moved horizontally by a slight amount to point E, so that the capillary 5 advances in the direction opposite from the second bonding point H. In this second embodiment, the damper 4 is closed at point E' during the reverse operation from point D to point E in the same manner as in the process from point C' to point C. When the damper 4 is thus closed during this (second) reverse operation, the delivery of the wire 3 from the capillary 5 is halted, and the slack at the lower end portion of the capillary 5 resulting from the wire 3c delivered during the reverse operation up to this point is eliminated by the tension applied to the portion of the wire 3 that lies between point C to point E.

As a result, the wire 3 assumes a shape formed by the movement of the capillary 5 moved from point C to point E, and, as described above, the slack at the lower end portion of the capillary 5 is eliminated by the applied tension; thus, a strong kink 3b is formed in the wire 3 at the lower end portion of the capillary 5. The wire 3 delivered from this point C to point E forms a trapezoidal length portion (see FIG. 6(b)) of the wire loop.

From point E where the (second) reverse operation is ended, the damper 4 is opened and raised to point F, thus delivering wire that is required to form an inclined portion 33 (see FIG. 6(b)). Afterward, the damper 4 is closed. When the damper 4 is closed, no further wire 3 is delivered even if the capillary 5 is subsequently moved.

Next, the capillary 5 is moved along a circular arc with a radius centered on the first bonding point A or on a point near the first bonding point A until the capillary 5 is reached at point G which is located above the second bonding point H. Then, the capillary 5 is lowered to the second bonding point H, and bonding of the wire 3 to the second bonding point H is performed.

Since the process of moving the capillary 5 from point E to the second bonding point H has no direct relationship with the feature of the present invention, it is possible to perform an operation similar to the operation disclosed in the conventional method or to perform various other operations.

Figure 5:
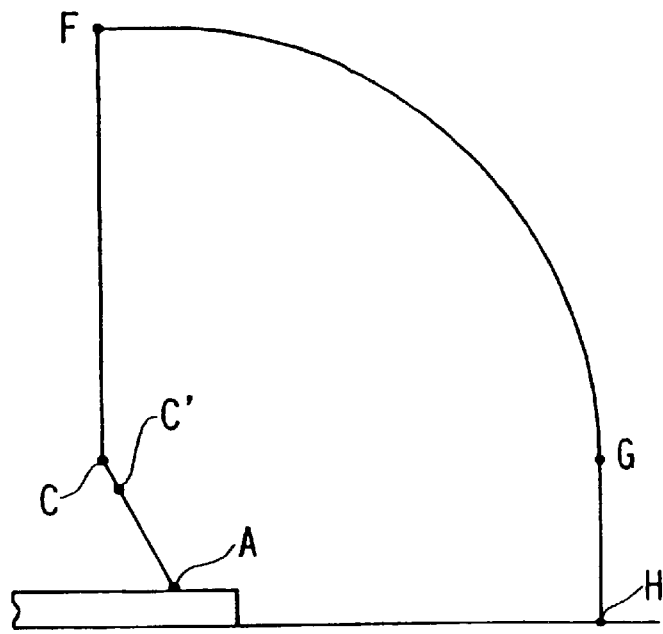
FIG. 5 illustrates a moving path of the capillary according to the third embodiment of the method of the present invention.

FIG. 5 illustrates a moving path of the capillary according to a third embodiment of the present invention. In the first and second embodiments (FIGS. 1 through 4), the capillary 5 is raised from the first bonding point A to point B; and then the capillary makes a reverse operation so that it moves horizontally to point C. However, in the third embodiment shown in FIG. 5, a reverse operation is performed so that the capillary 5 is moved obliquely directly from the first bonding point A to point C; in other words, the reverse operation in this third embodiment includes raising of the capillary 5 from the first bonding point A and moving the capillary 5 in the direction opposite from the second bonding point H; and the clamper 4 is closed at point C' during this oblique reverse operation and then opened at point C. An effect similar to that of the first embodiment is obtained by the third embodiment.

In three embodiments described above, the damper 4 is raised and lowered along with the capillary 5. However, the present invention is applicable to a method in which the only the capillary 5 is moved (and the damper 4 is not raised or lowered) or in which the damper 4 is raised and lowered independently from the capillary 5.

As seen from the above, according to the present invention, tension is applied to the wire while the damper is temporarily closed during the reverse operation of the capillary. Accordingly, a strong kink can be formed at the uppermost point of the neck height portion of the resulting loop; in addition, a stable wire loop shape that has a high shape retention force can be formed; and it can form a lower wire loop shape. Moreover, for a trapezoidal wire loop, a strong kink can be formed in the bent portion of the loop.

What is claimed is:

1. A wire bonding method wherein a reverse operation in which a capillary is moved in a direction away from a second bonding point is performed during a wire loop formation operation which connects a first bonding point and a second bonding point with a wire, said method being characterized in that a clamper for the wire is temporarily closed during said reverse operation so that tension is applied to said wire.

2. A wire bonding method for bonding a first bonding point and then a second bonding point by a bonding wire that passes through a capillary so as to form a wire loop between said first and second bonding points, said method comprising the steps of:

bonding said bonding wire to said first bonding point;

raising said capillary to a first raised point with a clamper provided above said capillary for holding said bonding wire being opened so as to deliver said bonding wire;

performing a reverse operation so as to move said capillary in a direction away from said second bonding point, thus bringing said capillary to a second raised point;

closing said clamper at one point during said reverse operation so as to apply tension to said bonding wire;

raising said capillary from said second raised point to a third raised point with said clamper opened thus delivering said bonding wire;

closing said clamper at said third raised point; and moving said capillary above said second bonding point and bonding said bonding wire to said second bonding point, thus forming a loop between said first and second bonding points and having a kink thereon.

3. A bonding method according to claim 2, further comprising a step of performing another reverse operation in which said capillary is moved further in a direction opposite from said second bonding point, said another reverse operation being performed after said reverse operation is performed and before said capillary is raised to said third raised point, thus forming another kink on said loop.

4. A bonding method according to claim 2, wherein said reverse operation is an oblique reverse operation in which said capillary is moved in said direction opposite from said second bonding point while being raised after said bonding of said bonding wire to said first bonding point.

* * * * *